United States Patent
Assaad et al.

(10) Patent No.: US 9,866,099 B1
(45) Date of Patent: Jan. 9, 2018

(54) ADAPTIVE HIGH-SIDE GATE DRIVE FOR RINGING MITIGATION IN SWITCHING POWER CONVERTERS

(71) Applicant: TEXAS INSTRUMENTS INCORPORATED, Dallas, TX (US)

(72) Inventors: Rida Shawky Assaad, Murphy, TX (US); Ming Sun, Tempe, AZ (US); Jeffrey Morroni, Parker, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/395,165

(22) Filed: Dec. 30, 2016

(51) Int. Cl.
- *H02M 1/08* (2006.01)
- *H02M 1/00* (2006.01)
- *H02M 3/158* (2006.01)
- *H02M 1/088* (2006.01)

(52) U.S. Cl.
CPC .............. *H02M 1/00* (2013.01); *H02M 1/08* (2013.01); *H02M 1/088* (2013.01); *H02M 3/158* (2013.01); *H02M 2001/0003* (2013.01); *H02M 2001/0029* (2013.01); *H02M 2001/0048* (2013.01)

(58) Field of Classification Search
CPC . H02M 2001/0029; H02M 2001/0048; H02M 1/08; H02M 1/088; H02M 3/156

USPC .......................................... 327/108, 109, 110
See application file for complete search history.

(56) References Cited

U.S. PATENT DOCUMENTS

| | | | | |
|---|---|---|---|---|
| 2006/0220699 A1* | 10/2006 | Labbe | ............... | H03K 17/08122 327/108 |
| 2011/0101939 A1* | 5/2011 | Leng | ..................... | H02M 3/156 323/282 |
| 2013/0063114 A1* | 3/2013 | Agrawal | ................. | H02M 1/38 323/283 |
| 2014/0321178 A1* | 10/2014 | Cyr | ......................... | H02M 1/08 363/131 |

\* cited by examiner

*Primary Examiner* — Timothy J Dole
*Assistant Examiner* — Ishrat Jamali
(74) *Attorney, Agent, or Firm* — John R. Pessetto; Charles A. Brill; Frank D. Cimino

(57) ABSTRACT

A power converter includes a high side device, a low side device connected to the high side device at a switch node, an inductor connected to the high side device and the low side device at the switch node, and a high side driver. The high side driver is configured to drive a gate of the high side device at a first current for a first period of time. In response to the first period of time ending, the high side driver is configured to step down the first current for a second period of time. In response to the second period of time ending, the high side driver is configured to drive the gate of the high side device at the first current.

18 Claims, 3 Drawing Sheets

ADAPTIVE HIGH-SIDE GATE DRIVE FOR RINGING MITIGATION IN SWITCHING POWER CONVERTERS

BACKGROUND

A switching power converter is an electronic circuit that converts an input direct current (DC) supply voltage into one or more DC output voltages that are higher or lower in magnitude than the input DC supply voltage. A switching power converter that generates an output voltage lower than the input voltage is termed a buck or step-down converter. A switching power converter that generates an output voltage higher than the input voltage is termed a boost or step-up converter.

A typical switching power converter may include a high side device (i.e., switch) and a low side device (i.e., switch) that alternately open and close a current path through a switch node to an inductor and capacitor. By opening and closing the high side device and the low side device alternately, a square wave type voltage signal is received at the switch node. This signal then is filtered by the inductor and capacitor (i.e., averaged) to generate a DC output signal that may be provided to an electrical load. Switching power converters are widely used to power electronic devices, particularly battery-powered devices, such as portable cellular phones, laptop computers, and other electronic systems in which efficient use of power is desirable.

SUMMARY

In accordance with at least one embodiment of the invention, a power converter includes a high side device, a low side device connected to the high side device at a switch node, an inductor connected to the high side device and the low side device at the switch node, and a high side driver. The high side driver is configured to drive a gate of the high side device at a first current for a first period of time. In response to the first period of time ending, the high side driver is configured to step down the first current for a second period of time. In response to the second period of time ending, the high side driver is configured to drive the gate of the high side device at the first current.

Another illustrative embodiment is a high side driver that includes a weak driver and a strong driver. The weak driver is configured to close a first switch in response to a first period of time beginning. The first switch is coupled to the gate of the high side device. The strong driver is configured to close a second switch in response to the first period of time beginning to drive the high side device at a first current. The strong driver is also configured to open the second switch in response to the first period of time ending to drive the high side device at a second current. The strong driver is also configured to close the second switch a second time in response to a second period of time ending to drive the high side device at the first current. The second switch is coupled to the gate of the high side device. The first current is greater than the second current.

Yet another illustrative embodiment is a method for driving a high side device in a switching power converter to mitigate ringing in the switch node of the switching power converter. The method includes driving the gate of the high side device at a first current for a first period of time. The method also includes, in response to the first period of time ending, driving the gate of the high side device at a second current for a second period of time, the second current being less than the first current. The method also includes, in response to the second period of time ending, driving the gate of the high side device at the first current.

BRIEF DESCRIPTION OF THE DRAWINGS

For a detailed description of various examples, reference will now be made to the accompanying drawings in which.

NOTATION AND NOMENCLATURE

Figure 1:
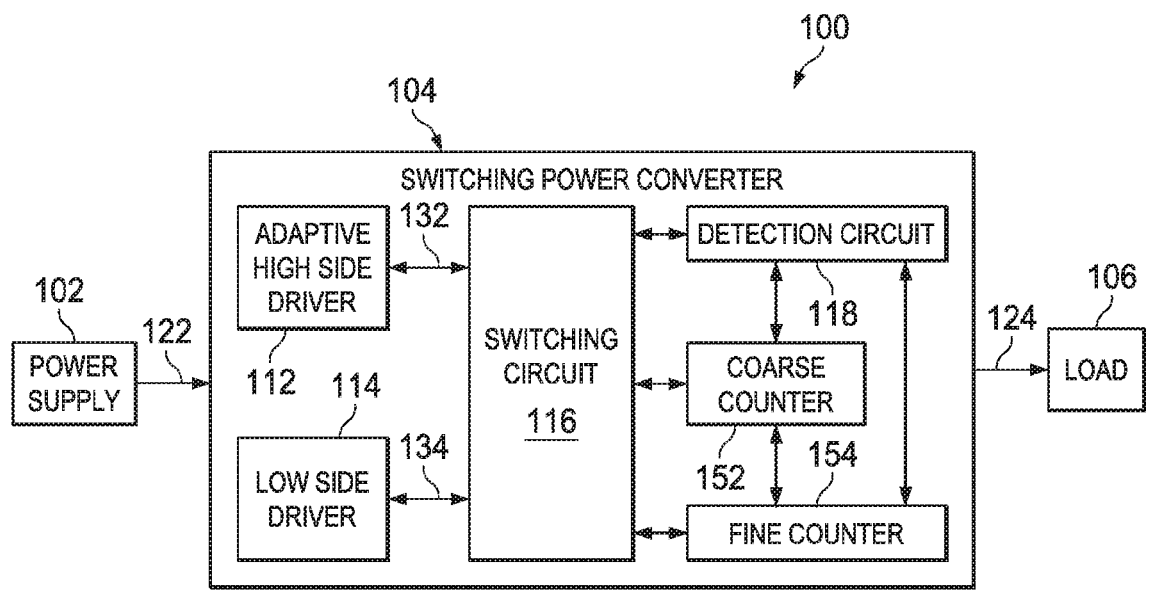
FIG. 1 shows an illustrative block diagram of a power conversion system in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Switching converters are high efficiency electronic devices that translate a supply voltage to another voltage. For example, a switching converter may step up one voltage to a higher voltage or may step down one voltage to a lower voltage. In switching converters, power is transferred to the output of the converter by applying the input voltage to a switch node between two switches that alternate being switched open and closed and averaging the resulting waveform. However, a parasitic inductance, created due to the package or the printed circuit board (PCB) upon which the switching converter is utilized, is excited by the fast switching transients which generates significant ringing at the switch node. This leads to degraded device reliability, increased high-frequency EMI transmissions, and increased core-losses. In order to mitigate ringing at the switch node, the damping factor of an equivalent RLC network of the power loop in the converter should be kept large as the voltage in the switch node transitions during switching. By controlling the change in current with respect to the change in time when the high side device is closed, it is possible to maintain a large damping factor.

In accordance with various examples, an adaptive high side gate driver is provided that segments the current drive into three phases over three periods of time. A large gate drive current is provided on the high side device over a short pulse over a first period of time followed by a small gate drive current for a second period of time. This dampens the change in current with respect to change in time until the voltage in the switch node begins to rise. Once the voltage in the switch node begins to rise, a large gate drive current is provided on the high side device. This enables control in the change in current with respect to the change in time to provide ringing mitigation in the voltage at the switch node.

FIG. 1 shows an illustrative block diagram of a power conversion system 100 in accordance with various examples. The power conversion system 100 may include a power supply 102, a switching power converter 104, and a load 106. Power supply 102 may be any type of DC power supply to provide electrical energy to the switching power converter 104. In some embodiments, the power supply 102 is a voltage regulator that provides a constant input voltage 122 to the switching power converter 104.

The switching power converter 104 may be configured to receive the input voltage 122 and translate the input voltage 122 into an output voltage 124 at a second level. For example, the switching power converter 104 may be configured to step up the input voltage 122 to generate an output voltage 124 at a higher level, and/or the switching power converter 104 may be configured to step down the input voltage 122 to generate an output voltage 124 at a lower level. The output voltage 124 then may drive electric load 106.

Figure 2:
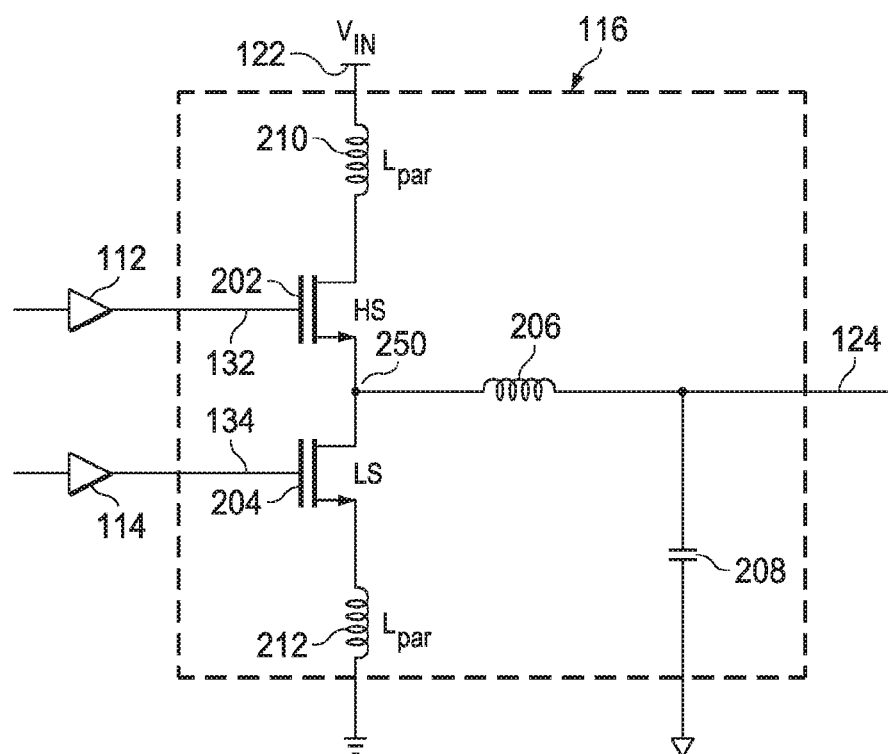
FIG. 2 shows an illustrative circuit diagram of a switching circuit being driven by an adaptive high side driver and a low side driver in accordance with various examples.

The switching power converter 104 may include an adaptive high side driver 112, a low side driver 114, a switching circuit 116, a detection circuit 118, a coarse counter 152, and a fine counter 154. FIG. 2 shows an illustrative circuit diagram of the switching circuit 116 being driven by adaptive high side driver 112 and low side driver 114 in accordance with various examples. The switching circuit 116 may include a high side device 202, a low side device 204, and an inductor 206 connected at a switch node 250. The switching circuit 116 may also include a capacitor 208. The high side and low side devices may act as switches, and thus, may be power transistors. In some embodiments, the high side device 202 and the low side device 204 are n-channel metal oxide semiconductor (NMOS) transistors. However, in alternative embodiments, the high side device 202 and the low side device 204 may be any type of transistor, including p-channel metal oxide semiconductor (PMOS) transistors, a p-type junction gate field-effect transistor (PJFET), a n-type junction gate field-effect transistor (NJFET), and a bipolar junction transistor (BJT) (including PNP and NPN transistors).

The high side device 202 and the low side device 204 act to drive the inductor 206 and capacitor 208, acting as an LC tank, in addition to load 106. Therefore, the inductor 206 and capacitor 208 act to filter the input voltage 122 at the output voltage 124. The high side device 202 and low side device 204 are alternatively switched open and closed to generate an approximate square wave pattern at the switch node 250.

Thus, the low side driver is configured to drive the low side device 204 with drive signal 134 to cause the low side device 204 to alternatively open and close. Similarly, the adaptive high side driver 112 is configured to the drive the high side device with drive signal 132 to cause the high side device 202 to alternatively open and close. The voltage at the switch node 250 (the approximate square wave voltage) is filtered out (averaged) into the DC output voltage 124 which is used to supply the load 106.

However, the parasitic inductance, shown as Lpar 210 and Lpar 212, in the power loop, inside the package or the PCB in which the switching circuit 116 is utilized, is excited by fast switching transients which generates ringing in the voltage at the switch node 250. In order to mitigate any ringing in voltage at the switch node 250, the change in current with respect to the change in time may be controlled in the high side device 202 through the drive signal 132 generated by the adaptive driver 112.

In order to control the change in current with respect to the change in time in the high side device 202, to close the high side device 202, the adaptive high side driver 112 may be configured to generate a short pulse at a first drive current (a relatively large gate drive current which, in some embodiments, may be approximately 350 mA) for a first period of time. This short pulse of drive current (in some embodiments approximately 2 ns) enables the Vgs of the high side device 202 to reach its threshold voltage. Once the first period of time has ended (the Vgs on the high side device 202 has reached its threshold voltage), the high side driver 202 may be configured to step down the drive current to a second lower drive current (a relatively small gate drive current which, in some embodiments, may be less than 50 mA) for a second period of time. By lowering the drive current for the high side device 202 during the second period of time, the drain current of the high side device 202 will ramp relatively slowly which provides a low change in current with respect to change in time. Once, the voltage in the switch node 250 begins to rise, the second period of time ends, and the adaptive high side driver 112 will again drive the high side device 202 with the first drive current (i.e., the relatively high drive current (e.g., approximately 350 mA) that drove the high side device 202 during the first period of time). In some embodiments, the adaptive high side driver 112 may be configured to continue to drive the high side device 202 at the first drive current until the high side device 202 is turned fully ON and thus, the high side device 202 is closed. By controlling this change in current with respect to the change in time during the closing of the high side device 202 in this manner, ringing at the switch node may be mitigated.

Figure 3:
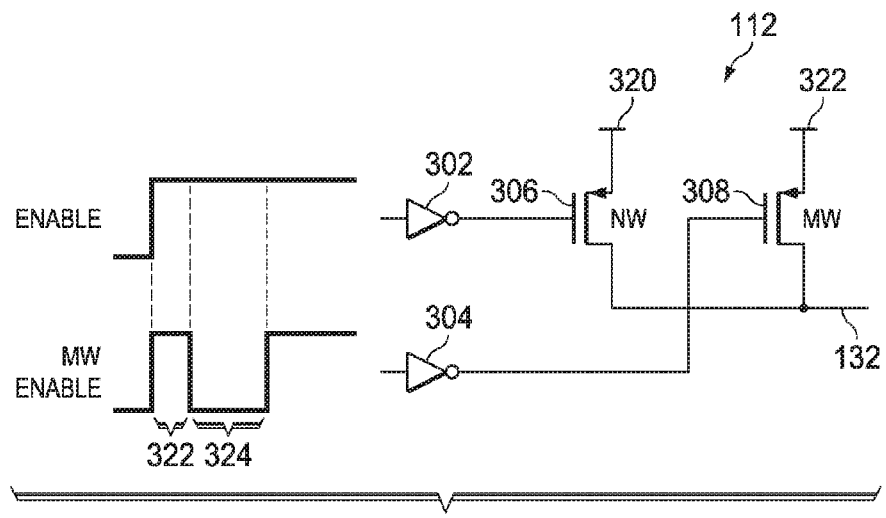
FIG. 3 shows an illustrative circuit diagram of an adaptive high side driver in accordance with various examples.

FIG. 3 shows an illustrative circuit diagram of adaptive high side driver 112 in accordance with various examples. The adaptive high side driver 112 may include a weak driver 302, a strong driver 304, a first switch (the NW switch 306), and a second switch (the MW switch 308). The NW switch 306 and the MW switch 308 may, in some embodiments, be PMOS transistors; however, in alternative embodiments, the NW switch 306 and the MW switch 308 may be any type of switch including NMOS transistors, PJFETs, NJFETs, BJTs, and/or any combination thereof.

In response to receiving an enable signal (a signal indicating that the high side driver 202 is to close), both the weak driver 302 and the strong driver 304 are configured to close their respective switches. In other words, in response to receiving the enable signal, the weak driver 302 may be configured to generate a drive current to close the NW switch 306 and the strong driver 304 may be configured to generate a drive current to close the MW switch 308. When the NW switch 306 closes, a drive current 320 that is equal to the second drive current discussed above (i.e., the relatively low drive current which in some embodiments is less than 50 mA) drives the gate of the high side device 202 as at least part of the drive signal 132. When the MW switch 308 closes, a drive current 322 that is just less than the first current discussed above drives the gate of the high side device as at least part of the drive signal 132. Thus, when the MW switch 308 is closed, the combination of the drive current 320 and the drive current 322 equals the first current discussed above (e.g., approximately 350 mA) as the drive signal 132 to drive the gate of the high side device 202.

The weak driver 302 may be enabled for the entire time the high side device 202 is configured to be closed. However, the strong driver 304 may be enabled for only a first period of time 322 and after a second period of time 324. Thus, when the enable signal is received, the first period of time begins, and the weak driver 302 drives the gate of the NW switch 306, causing the NW switch 306 to close, and the strong driver 304 drives the gate of the MW switch 308, causing the MW switch 308 to close a first time during the cycle (i.e., a cycle begins when the high side device 202 is closed and continues while the high side device 202 is opened and the low side device 204 is closed—a new cycle begins again when the high side device 202 is closed again). Thus, the first current drives the gate of the high side device 202 for the first period of time 322. The first period of time, may be a fixed period of time (in some embodiments approximately 2 ns) that enables the Vgs of the high side device 202 to reach its threshold voltage. Once the first period of time 322 ends, the strong driver 304 may remove drive current from the gate of the MW switch 308, thus opening the MW switch 308. This may stop the drive current 322 from driving the high side device 202. However, the weak driver 302 maintains drive current on the gate of the NW switch 306 which causes the NW switch 306 to remain closed. Thus, in response to the first period of time 322 ending, the drive current 320 may be the only drive current to drive the gate of the high side device 202. The time that the drive current 320 may be the only drive current to drive the gate of the high side device 202 is the second period of time 324. As discussed above, the ending of the second period of time 324 may correspond with a detection of a rising voltage at the switch node 250. Thus, the second period of time 324 may change from cycle to cycle as will be discussed below. Once the second period of time 324 ends, the strong driver 304, once again drives the gate of the MW switch 308 to close the MW switch 308 a second time during the cycle. Thus, the first current (i.e., the combination of drive currents 320 and 322) once again drives the gate of the high side device 202 as discussed above. In this way, the adaptive high side driver 112 may provide a segmented gate driver for the high side device 202 that provides the change in current with respect to the change in time that reduces and/or mitigates ringing in the voltage at the switch node 250.

Returning to FIG. 1, the detection circuit 118 may be any circuit that is configured to detect a rising voltage at the switch node 250. The detection circuit 118 may also make a determination of whether the rising voltage at the switch node 250 is detected before or after the MW switch 322 closes for the second time in a cycle. For example, a comparator (not shown) may be utilized to make this determination. The coarse counter 152 and the fine counter 154 may be utilized to adjust the second period of time 324 for an immediate subsequent cycle or any subsequent cycle. The coarse counter 152 may be any circuit that is configured to make coarse adjustments to the second period of time 324 for an immediate subsequent cycle while the fine counter 154 may be utilized to make fine adjustments to the second period of time 324 for an immediate subsequent cycle.

For example, the switching power converter 104 may be initialized to, for a first cycle of operation, to have a second period of time 324 of 0. In other words, the first time the high side device 202 switches closed, the second period of time 324 may be set to 0. In such a case, the MW switch 308 does not close a second time, and the first current (i.e., the relatively high drive current) drives the gate of the high side device 202 for the entire time the high side device 202 is closed during the first cycle. Thus, the time that the first time the MW switch 308 closes (which in the first cycle may be considered the second time the MW switch 308 closes) is compared to time that the rising voltage at the switch node 250 is detected. In this case, the time that the rising voltage at the switch node 250 is detected will be after the first and only time the MW switch 308 closes; therefore, the coarse counter will add a coarse delay unit to a coarse delay unit count. In some embodiments, each count in the coarse delay unit count corresponds to approximately 1-1.5 ns. In response to the added coarse delay unit to the coarse delay unit count, in the immediate subsequent cycle, (e.g., the second cycle), the second period of time 324 is increased from 0 by the amount of time corresponding to a coarse delay unit (e.g., 1-1.5 ns). This process (i.e., comparing the rising voltage at the switch node 250 to the closing of the MW switch 308 a second time during a cycle and adding a coarse delay unit in response to a determination that the rising voltage at the switch node 250 occurs after the closing of the MW switch 308 a second time during a single cycle) will repeat for each subsequent cycle until the detection circuit 118 detects the rising voltage at the switch node 250 occurs before the MW switch 308 closes a second time in a cycle.

Once, the detection circuit 118 detects rising voltage at the switch node 250 occurs before the MW switch 308 closes a second time in a cycle, the fine counter may be engaged and configured to subtract a fine delay unit to a fine delay unit count. In some embodiments, each count in the fine delay unit count corresponds to approximately 200-300 ps. In response to the subtracted fine delay unit to the fine delay unit count, in the immediate subsequent cycle, the second period of time 324 is decreased from the immediate previous cycle by the amount of time corresponding to a fine delay unit (e.g., 200-300 ps). In subsequent cycles, the fine delay unit count is either subtracted from or added to based on whether the rising voltage at the switch node 250 occurs after (add to the fine delay unit count) or before (subtract from the fine delay unit count) the closing of the MW switch 308 a second time in a cycle. If, for a threshold number of cycles in a row (e.g., four straight cycles) the fine delay unit count is added to, then the coarse counter 152 may be re-engaged and a coarse delay unit is added to the coarse delay unit count and the second period of time 324 is increased by the amount of time corresponding to a coarse delay unit (e.g., 1-1.5 ns) in the immediate subsequent cycle. Similarly, if, for a threshold number of cycles in a row (e.g., four straight cycles) the fine delay unit count is subtracted from, then the coarse counter 152 is re-engaged and a coarse delay unit is subtracted from the coarse delay unit count and the second period of time 324 is decreased by the amount of time corresponding to a coarse delay unit in the immediate subsequent cycle. In subsequent cycles, the coarse delay unit count is either subtracted from or added to based on whether the rising voltage at the switch node 250 occurs after (add to the coarse delay unit count) or before (subtract from the coarse delay unit count) the closing of the MW switch 308 a second time in a cycle until the coarse delay unit count overshoots (i.e., if the coarse delay unit count is added to, there is overshoot as soon as the rising voltage at the switch node 250 is detected before the closing of the MW switch 308 in the cycle and if the coarse delay unit count is subtracted from, there is overshoot as soon as the rising voltage at the switch node 250 is detected after the closing of the MW switch 308 in the cycle). Once a determination is made that there is overshoot, the fine counter 154 is re-engaged to control, as discussed above, the timing of the second period of time 324. In this way, the second period of time 324 is regulated so that the MW switch 308 closes at a time that corresponds closest with the time the voltage at the switch node 250 begins to rise. This, in turn, as discussed previously, regulates the change in current with respect to the change in time to reduce and/or mitigate ringing in the voltage at the switch node 250.

In addition to the second period of time 324 affecting the ringing in the voltage of the switch node 250, the ratio of the weak drive and the strong drive in the adaptive high side driver 112 also may affect the ringing in the voltage of the switch node 250. Therefore, in some embodiments, a saturation count loop may focus on the coarse delay unit count. The coarse delay unit count may saturate. To alleviate the possibility of saturation in the coarse unit delay count, the saturation count will compare the coarse unit delay count to the saturation level of the coarse counter 152. Once the coarse unit delay count drops below 25% of the range of the coarse counter 152 and/or rises above 75% of the range of the coarse counter, the strength of the adaptive high side driver 112 may be adjusted. In some embodiments, if the coarse unit delay count drops below 25% of the range of the coarse counter 152, the number of fingers in the NW switch 306 and/or the MW switch 308 is adjusted such that the adaptive high side driver 112 provides a weaker (i.e., lower) drive current to the gate of the high side device 202. However, in some embodiments, if the coarse unit delay count rises above 75% of the range of the coarse counter 152, the number of fingers in the NW switch 306 and/or the MW switch 308 is adjusted such that the adaptive high side driver 112 provides a stronger (i.e., higher) drive current to the gate of the high side device 202. This may provide an additional measure to reduce ringing in the voltage of the switch node 250.

Figure 4:
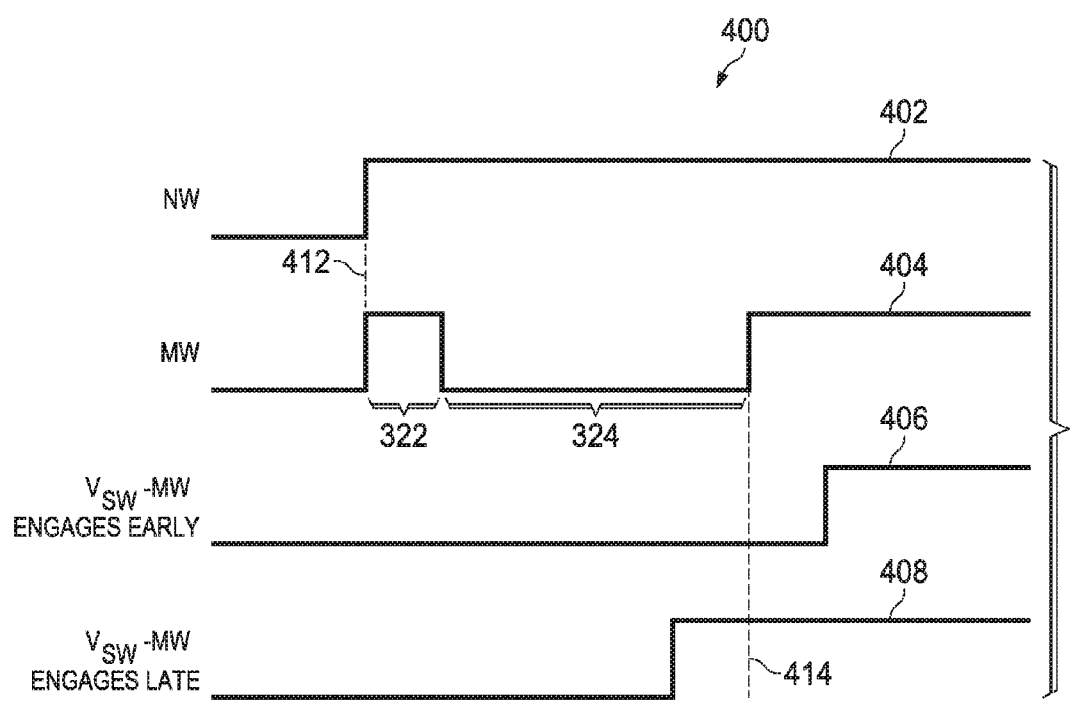
FIG. 4 shows an illustrative timing diagram in accordance with various examples.

FIG. 4 shows an illustrative timing diagram 400 in accordance with various examples. The timing diagram 400 shows an illustrative enable signal 402 for the weak driver 302 to drive the gate of the NW switch 306. As shown, the enable signal 402 is HIGH the length of the cycle that the high side device 202 is to be closed. Thus, the weak driver 302 is configured to drive the gate of the NW switch 306 to keep the NW switch 306 closed for the entire cycle that the high side device 202 is to be closed. The timing diagram 400 also shows an illustrative enable signal 404 for the strong driver 304 to drive the gate of the MW switch 308. As shown, the enable signal 404 is HIGH for the first period of time 322. Thus, for the first period of time 322, the strong driver 304 drives the gate of the MW switch 308 to keep the MW switch 308 closed for the first period of time 322. Thus, during the first period of time 322, the gate of the high side device 202 is driven by the combined currents 320 and 322 (i.e., a relatively large current). However, the enable signal 404 is LOW for the second period of time 324. Thus, for the second period of time 324, the strong driver 304 causes the MW switch 308 to open for the second period of time 324. Thus, during the second period of time 324, the gate of the high side device 202 may be driven by current 320 only (i.e., a relatively small current). Also, as shown, the enable signal 404 is HIGH upon the ending 414 of the second period of time 324. Thus, for the remainder of the cycle that the high side device 202 is to be closed, after the second period of time 324 ends, the strong driver 304 drives the gate of the MW switch 308 to keep the MW switch 308 closed for the remainder of the cycle. Thus, during the remainder of the cycle that the high side device 202 is to be closed, the gate of the high side device 202 is driven by the combined currents 320 and 322 (i.e., a relatively large current).

The signal 406 illustrates a comparison of the time of a rising voltage of the switch node 250 to the closing of the MW switch 308 a second time during a cycle (i.e., the end 414 of the second period of time 324). In the example of signal 406, the MW switch 308 is closed prior to the rising voltage of the switch node 250 is detected. Therefore, either the coarse delay unit count and/or the fine delay unit count is added to, so that in an immediate subsequent cycle, the MW switch 308 will close later in the cycle. In the example of signal 408, the MW switch 308 is closed after the rising voltage of the switch node 250 is detected. Therefore, either the coarse delay unit count and/or the fine delay unit count is subtracted from, so that in an immediate subsequent cycle, the MW switch 308 will close earlier in the cycle.

Figure 5:
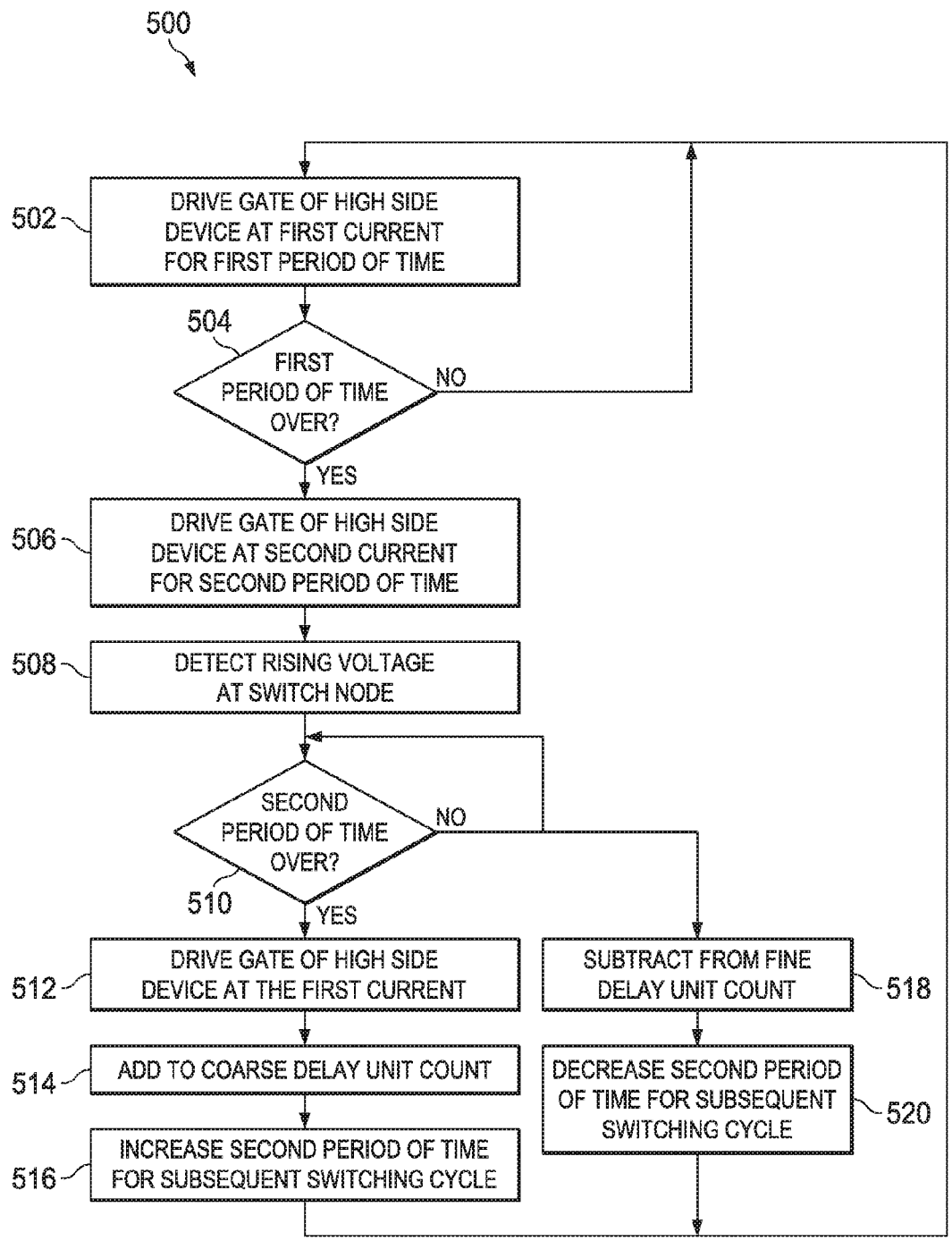
FIG. 5 shows an illustrative flow diagram of a method for driving a high side device in a switching power converter to mitigate ringing in a switch node of the switching power converter in accordance with various examples.

FIG. 5 shows an illustrative flow diagram of a method 500 driving a high side device in a switching power converter to mitigate ringing in a switch node of the switching power converter in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 500, as well as other operations described herein, can be performed by the switching power converter 104 (including the adaptive high side driver 112, low side driver, switching circuit 116, detection circuit 118, coarse counter 152, and/or fine counter 154) and implemented in logic and/or by a processor executing instructions stored in a non-transitory computer readable storage medium.

The method 500 begins in block 502 with driving the gate of a high side device, such as high side device 202, at a first current for a first period of time, such as first period of time 322. For example, an adaptive high side driver, such as adaptive high side driver 112, may be configured to drive the gate of the high side device at a relatively high current for a fixed period of time (e.g., 2 ns). In block 504, the method 500 continues with determining whether the first period of time is over. For example, a determination may be made whether 2 ns has elapsed since the adaptive high side driver began driving the gate of the high side device. If, in block 504, a determination is made that the first period of time is not over, then the method 500 continues in block 502 with driving the gate of the high side device at the first current.

If, however, in block 504, a determination is made that the first period of time is over, then the method 500 continues in block 506 with driving the gate of the high side device at a second current for a second period of time. For example, the adaptive high side driver may be configured to drive the gate of the high side device at a relatively low current for a second period of time, such as second period of time 324. Thus, the first current may be greater than the second current.

In block 508, the method 500 continues with detecting a rising voltage at a switch node. For example, a detection circuit, such as the detection circuit 118, may be configured to monitor a voltage at a switch node, such as switch node 250, attached to the high side device to detect when the voltage in the switch node begins to rise. The method 500 continues in block 510 with determining whether the second period of time is over. For example, the second period of time may be over at the time that a switch, such as MW switch 308, connected to a strong driver, such as strong driver 304, in the adaptive high side driver has closed for a second time during a single cycle.

If, in block 510, a determination is made that the second period of time is over, then the method 500 continues in block 512 with driving the gate of the high side device at the first current. For example, once the second switch closes for the second time in the cycle, the gate of the high side device is driven at the relatively high first current.

In block 514, the method 500 continues with adding to a coarse delay unit count. For example, because the rising voltage at the switch node is detected after the second period of time is over, a coarse counter, such as the coarse counter 152, may be configured to add a coarse delay unit to a coarse delay unit count. The method 500 continues in block 516 with increasing the second period of time for a subsequent switching cycle. For example, with an increase in the coarse delay unit count, the second period of time is increased in the subsequent cycle by the amount of time corresponding to the coarse delay unit count (e.g., 1-1.5 ns). The method 500 then may continue in block 502 in a subsequent cycle with driving the gate of the high side device at the first current for the first period of time.

If, in block 510, a determination is made that the second period of time is not over, then the method 500 continues in block 510 with determining whether the second period of time is over. Additionally, because the rising voltage at the switch node is detected before the second period of time is over, the method 500 continues in block 518 with subtracting from a fine delay unit count. For example, a fine counter, such as fine counter 154, may be configured to subtract a fine delay unit to a fine delay unit count. In block 520, the method continues with decreasing the second period of time for a subsequent switching cycle. For example, with a decrease in the fine delay unit count, the second period of time is decreased in the subsequent cycle by the amount of time corresponding to the fine delay unit count (e.g., 200-300 ps). The method 500 then may continue in block 502 in a subsequent cycle with driving the gate of the high side device at the first current for the first period of time.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A power converter, comprising:
   a high side device;
   a low side device connected to the high side device at a switch node;
   an inductor connected to the high side device and the low side device at the switch node; and
   a high side driver configured to drive a gate of the high side device at a first current for a first period of time, in response to the first period of time ending, step down the first current for a second period of time, and in response to the second period of time ending, drive the gate of the high side device at the first current;
   wherein the high side driver includes:
   a weak driver configured to close a first switch in response to the first period of time beginning, the first switch coupled to the gate of the high side device; and
   a strong driver configured to close a second switch in response to the first period of time beginning, open the second switch in response to the first period of time ending, and close the second switch a second time in response to the second period of time ending.

2. The power converter of claim 1, further comprising:
   a detection circuit configured to detect a rising voltage at the switch node; and
   a coarse counter configured to add to a coarse delay unit count in response to the detection circuit detecting the rising voltage at the switch node after the second switch closes the second time.

3. The power converter of claim 2, wherein, in response to the coarse counter adding to the coarse delay unit count, the second period of time is increased for a subsequent switching cycle.

4. The power converter of claim 3, wherein, in response to the coarse counter adding to the coarse delay unit count, the second period of time is increased by approximately 1 to 1.5 ns for the subsequent switching cycle.

5. The power converter of claim 3, further comprising a fine counter configured to, in response to the detection circuit detecting the rising voltage at the switch node before the second switch closes the second time, subtract from a fine delay unit count.

6. The power converter of claim 5, wherein, in response to the fine counter subtracting the fine delay unit count, the second period of time is decreased for the subsequent switching cycle.

7. The power converter of claim 6, wherein, in response to the fine counter subtracting the fine delay unit count, the second period of time is decreased by approximately 200 to 300 ps for the subsequent switching cycle.

8. The power converter of claim 3, further comprising a coarse counter saturation detection circuit configured to determine whether the coarse count is above a first threshold value or below a second threshold value.

9. The power converter of claim 1, wherein the first switch is configured to remain closed during the second period of time.

10. A high side driver, comprising:
    a weak driver configured to close a first switch in response to a first period of time beginning, the first switch coupled to a gate of a high side device; and
    a strong driver configured to close a second switch in response to the first period of time beginning to drive the high side device at a first current, open the second switch in response to the first period of time ending to drive the high side device at a second current, and close the second switch a second time in response to a second period of time ending to drive the high side device at the first current;
    wherein the second switch is coupled to the gate of the high side device; and
    wherein the first current is greater than the second current.

11. The high side driver of claim 10, wherein the first switch is configured to remain closed during the second period of time.

12. The high side driver of claim 10, wherein the first period of time is approximately 2 ns.

13. The high side driver of claim 10, further comprising:
a detection circuit configured to detect a rising voltage at a switch node connected to the high side device; and
a coarse counter configured to add to a coarse delay unit count in response to the detection circuit detecting the rising voltage at the switch node after the second switch closes the second time.

14. The high side driver of claim 13, wherein in response to the coarse counter adding to the coarse delay unit count, the second period of time is increased for a subsequent switching cycle of the high side device.

15. The high side driver of claim 14, further comprising a fine counter configured to, in response to the detection circuit detecting the rising voltage at the switch node before the second switch closes, subtract from a delay unit count.

16. The high side driver of claim 15, wherein, in response to the fine counter subtracting the fine delay unit count, the second period of time is decreased for the subsequent switching cycle of the high side device.

17. A method for driving a high side device in a switching power converter to mitigate ringing in a switch node of the switching power converter, comprising:
driving a gate of the high side device at a first current for a first period of time;
in response to the first period of time ending, driving the gate of the high side device at a second current for a second period of time, the second current being less than the first current; and
in response to the second period of time ending, driving the gate of the high side device at the first current;
detecting, by a detection circuit, a rising voltage at the switch node;
in response to the detection circuit detecting the rising voltage at the switch node after the second period of time ends, adding to a coarse delay unit count; and
in response to the adding to the coarse delay unit count, increasing the second period of time for a subsequent switching cycle.

18. The method of claim 17, further comprising:
in response to the detection circuit detecting the rising voltage at the switch node before the second period of time ends, subtracting from a fine delay unit count; and
in response to the subtracting from the fine delay unit count, decreasing the second period of time for the subsequent switching cycle.

\* \* \* \* \*